(12) United States Patent
Kim

(10) Patent No.: US 8,629,697 B2
(45) Date of Patent: Jan. 14, 2014

(54) SEMICONDUCTOR INTEGRATED CIRCUIT AND METHOD OF OPERATING THE SAME

(75) Inventor: Dong-Kyun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 6 days.

(21) Appl. No.: 13/486,837

(22) Filed: Jun. 1, 2012

(65) Prior Publication Data
US 2013/0321033 A1 Dec. 5, 2013

(51) Int. Cl.
*H03B 1/00* (2006.01)
*H03K 3/00* (2006.01)

(52) U.S. Cl.
USPC .......................................... 327/109; 327/108

(58) Field of Classification Search
USPC .................... 327/108, 109; 326/83, 86, 87
See application file for complete search history.

(56) References Cited

U.S. PATENT DOCUMENTS

| | | | | | |
|---|---|---|---|---|---|
| 5,508,635 | A | * | 4/1996 | Kwon | 326/27 |
| 5,966,030 | A | * | 10/1999 | Schmitt et al. | 326/83 |
| 6,118,303 | A | * | 9/2000 | Schmitt et al. | 326/83 |
| 6,130,556 | A | * | 10/2000 | Schmitt et al. | 326/81 |
| 2011/0285426 | A1 | * | 11/2011 | Takahashi et al. | 327/109 |
| 2013/0063186 | A1 | * | 3/2013 | DeBeer et al. | 327/109 |

* cited by examiner

Primary Examiner — Adam Houston
(74) Attorney, Agent, or Firm — IP & T Group LLP

(57) ABSTRACT

Provided is a semiconductor integrated circuit including an internal voltage generator for generating an internal voltage. A semiconductor integrated circuit includes a dividing unit, a comparing unit, a driving unit, and a voltage level controlling unit. The dividing unit divides an internal voltage in a predetermined division ratio to output a feedback voltage. The comparing unit compares a feedback voltage with a reference voltage. The driving unit drives an internal voltage terminal in response to an output signal of the comparing unit. The voltage level controlling unit controls a voltage level of the output signal of the comparing unit in response to a first control signal that is activated at a predetermined time before an operation time point of an internal circuit using an internal voltage.

20 Claims, 4 Drawing Sheets

SEMICONDUCTOR INTEGRATED CIRCUIT AND METHOD OF OPERATING THE SAME

BACKGROUND

1. Field

Exemplary embodiments of the present invention relate to semiconductor design technology, and more particularly, to an internal voltage generating circuit of a semiconductor integrated circuit.

2. Description of the Related Art

Semiconductor memory devices, such as Dynamic Random Access Memory (DRAM) devices, are trending toward high speed, low power consumption, high-density process and low operation voltage. Most semiconductor memory devices include an internal voltage generator that uses external power supply voltages (e.g., VDD and VSS) to generate internal voltages necessary to operate various internal circuits. The main issue in designing the internal voltage generator is to maintain a constant internal voltage of a desired level.

Examples of the internal voltages include a core voltage VCORE supplied to a core region including a memory cell array, a high voltage VPP used to drive a word line or used in an overdriving operation, a back-bias voltage VBB supplied as a bulk voltage of an NMOS transistor of a core region, a cell plate voltage VCP used as a plate voltage of a memory cell capacitor, and a bit line precharge voltage VBLP used to precharge a bit line. Hereinafter, a core voltage generator for generating a core voltage VCORE will be described as an example.

FIG. 1 is a block diagram of a conventional core voltage generator included in a semiconductor memory device. FIG. 2 is a circuit diagram of the conventional core voltage generator illustrated in FIG. 1.

Referring to FIGS. 1 and 2, the core voltage generator includes a driving unit 110 configured to drive a core voltage VCORE, and an operation period defining unit 120 configured to detect a voltage level of the core voltage VCORE with respect to a reference voltage VREFC and define an operation period of the driving unit 110.

The driving unit 110 is a pull-up driving unit configured to pull-up drive the core voltage VCORE. The driving unit 110 receives an output signal VGS_PASS of the operation period defining unit 120 as a gate input, and includes a PMOS transistor having a source and a drain connected between a power supply voltage (VDD) terminal and a core voltage (VCORE) terminal.

The operation period defining unit 120 includes a dividing unit 122 configured to divide an internal voltage in a predetermined division ratio, a comparing unit 124 configured to compare the reference voltage VREFC and a feedback voltage VFBK fed back by the dividing unit 122 and output the comparison signal VGS_PASS, a sinking unit 126 connected to the core voltage (VCORE) terminal to decrease the voltage level of the core voltage VCORE when the voltage level of the core voltage VCORE increases excessively, and a precharge unit 128 configured to precharge an output (VGS_PASS) terminal of the comparing unit 124. The dividing unit 122 includes one or more resistors between the core voltage (VCORE) terminal and a ground voltage (VSS) terminal with respect to an output terminal of the feedback voltage VFBK. Since the dividing unit 122 has resistors with the same voltage difference between both ends, the feedback voltage VFBK corresponds to a half core voltage VFBK that is a mean voltage between the core voltage VCORE and the ground voltage VSS. The comparing unit 124 includes a current-mirror differential amplifier, and may include an NMOS type.

A method for driving the conventional core voltage generator is will be described below with reference to FIG. 3.

FIG. 3 is a timing diagram illustrating a method for driving the conventional core voltage generator illustrated in FIG. 1.

Referring to FIG. 3, the dividing unit 122 generates the feedback voltage VFBK corresponding to the core voltage VCORE, and the comparing unit 124 continuously compares the feedback voltage VFBK with the reference voltage VREFC.

When an internal circuit (not illustrated) using the core voltage VCORE operates and a load current IL is generated, the voltage level of the core voltage VCORE decreases. Accordingly, the voltage level of the feedback voltage VFBK outputted from the dividing unit 122 decreases, and the driving unit 110 operates according to the comparison signal VGS_PASS outputted from the comparing unit 124. As the driving unit 110 operates, the voltage level of the core voltage VCORE increases to a target level. Thereafter, an operation of the driving unit 110 is interrupted by the dividing unit 122 and the comparing unit 124.

When the voltage level of the core voltage VCORE increases excessively due to the operation of the driving unit 110, the voltage level of the core voltage VCORE is adjusted to the target level by the sinking unit 126. Also, the precharge unit 128 precharges the output (VGS_PASS) terminal of the comparing unit 124 in a precharge period to restrict the operation of the driving unit 110.

However, the conventional core voltage generator has the following limitations.

As illustrated in FIG. 2, when the load current IL is generated excessively by the internal circuit, an excessive voltage drop of the core voltage VCORE occurs in the initial supply period of the core voltage VCORE. In this case, it takes a considerable time for the core voltage VCORE to reach the target level. That is, as a variation ΔV of the core voltage VCORE increases, it takes a longer recovery time for the core voltage VCORE to reach the target level. Thus, in the event of an excessive voltage drop of the core voltage VCORE, an unstable state of the voltage level of the core voltage VCORE continues due to a long recovery time of the core voltage VCORE, and the internal circuit malfunctions due to the unstable core voltage VCORE.

SUMMARY

An embodiment of the present invention is directed to a semiconductor integrated circuit for minimizing a recovery time of an internal voltage with a voltage drop, and a method for driving the semiconductor circuit.

In accordance with an embodiment of the present invention, a semiconductor integrated circuit includes: a driving unit configured to drive an internal voltage terminal; a first operation period defining unit configured to define a first operation period of the driving unit in response to a control signal that is activated at a predetermined time before an operation time point of an internal circuit using an internal voltage; and a second operation period defining unit configured to define a second operation period of the driving unit according to a voltage level state of the internal voltage with respect to a reference voltage.

In accordance with another embodiment of the present invention, a semiconductor integrated circuit includes: a comparing unit configured to compare a feedback voltage with a reference voltage; a driving unit configured to drive an internal voltage terminal in response to an output signal of the comparing unit; and a voltage level controlling unit configured to control a voltage level of the output signal of the comparing unit in response to a first control signal that is activated at a predetermined time before an operation time point of an internal circuit using an internal voltage.

In accordance with yet another embodiment of the present invention, a method for driving a semiconductor integrated circuit that drives an internal voltage terminal to a predetermined voltage according to a voltage level state of the internal voltage terminal, includes: operating a driving unit for driving the internal voltage terminal, before a predetermined operation time point, if an active command is activated; performing a predetermined operation by an internal voltage at the predetermined operation time point, while the driving unit is operating; and interrupting an operation of the driving unit if a voltage level of the internal voltage terminal with a voltage drop caused by the predetermined operation reaches a target level due to a continuous operation of the driving unit.

DETAILED DESCRIPTION

Figure 1:
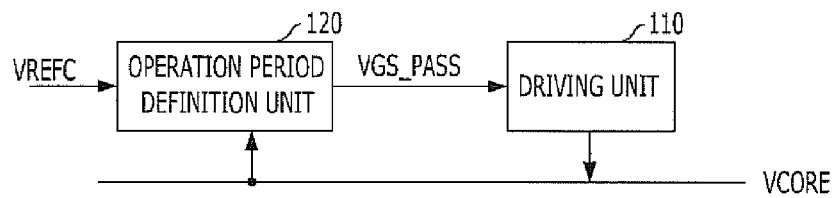
FIG. 1 is a block diagram of a conventional semiconductor integrated circuit.
Figure 2:
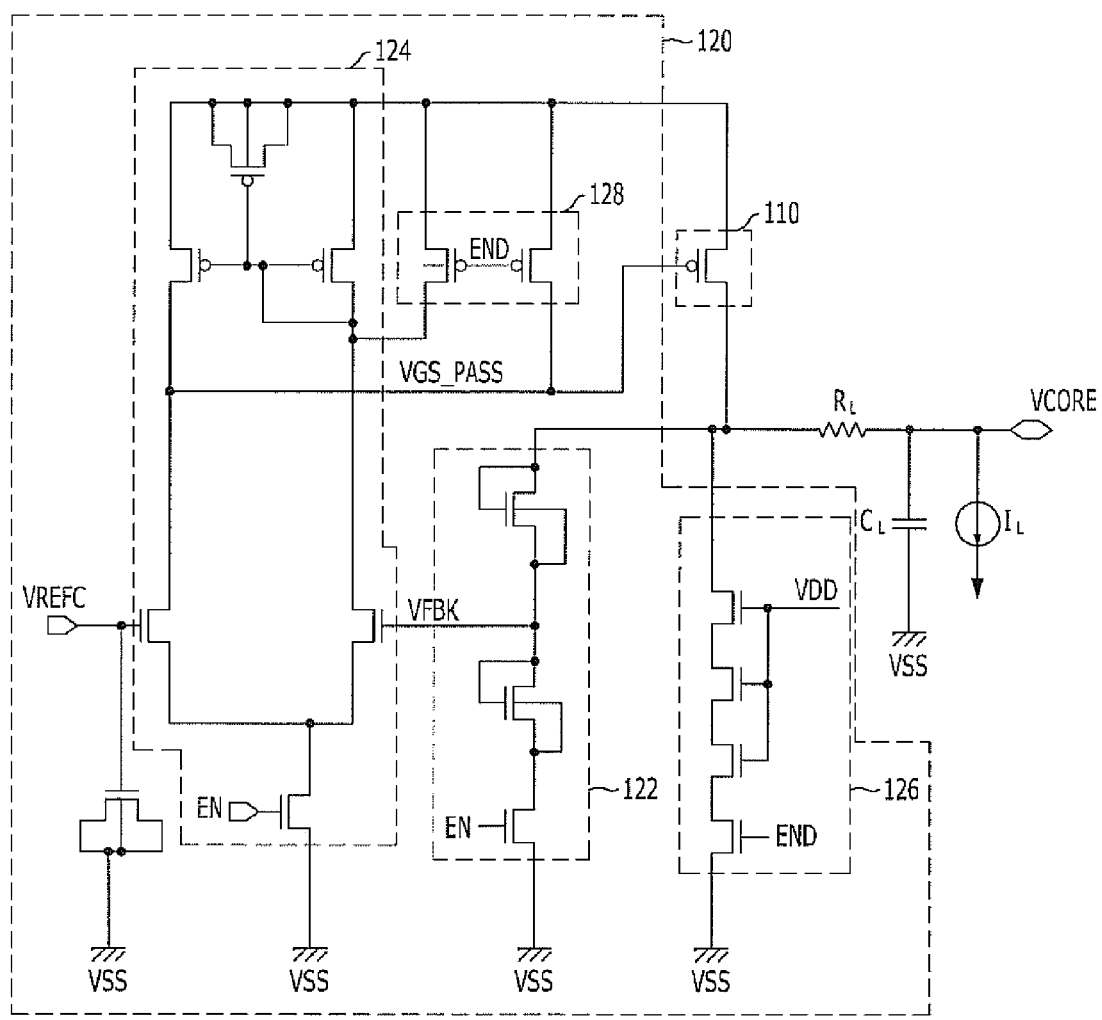
FIG. 2 is a circuit diagram of the conventional semiconductor integrated circuit illustrated in FIG. 1.
Figure 3:
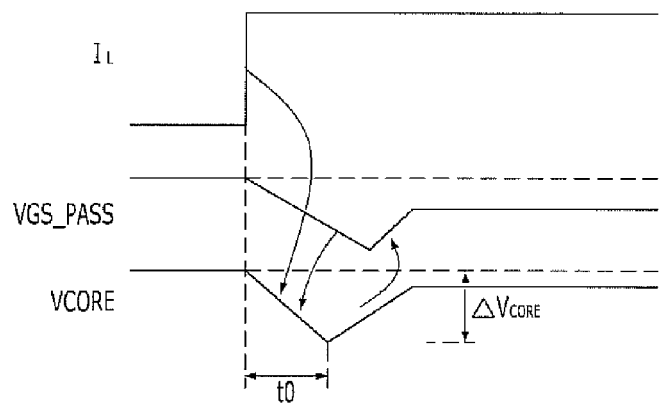
FIG. 3 is a timing diagram illustrating a method for driving the conventional semiconductor integrated circuit illustrated in FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

A semiconductor memory device is exemplified as a semiconductor integrated circuit in accordance with an exemplary embodiment of the present invention, and a core voltage generator is exemplified in the semiconductor memory device.

Figure 4:
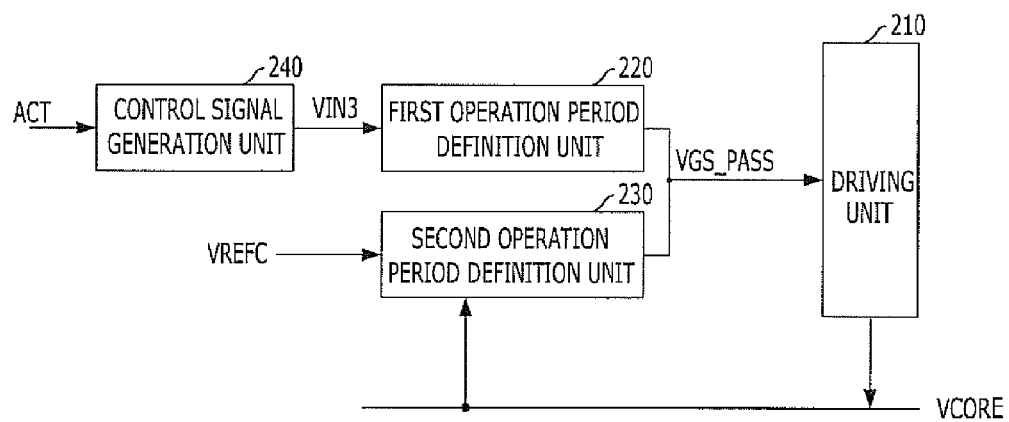
FIG. 4 is a block diagram of a semiconductor integrated circuit in accordance with an exemplary embodiment of the present invention.

FIG. 4 is a block diagram of a core voltage generator of a semiconductor memory device in accordance with an exemplary embodiment of the present invention.

Referring to FIG. 4, a core voltage generator in accordance with an exemplary embodiment of the present invention includes a driving unit 210 configured to drive a core voltage (VCORE) terminal, a first operation period defining unit 220 configured to define a first operation period of the driving unit 210 in response to a first control signal VIN3 that is activated at a predetermined time before an operation time point of an internal circuit (not illustrated) using a core voltage VCORE, a second operation period defining unit 230 configured to define a second operation period of the driving unit 210 according to a voltage level state of the core voltage VCORE with respect to a reference voltage VREFC, and a control signal generating unit 240 configured to generate the first control signal VIN3 in response to an active command ACT. The first operation period defining unit 220 and the second operation period defining unit 230 have a common output terminal.

The driving unit 210, the first operation period defining unit 220 and the second operation period defining unit 230 will be described below in detail with reference to FIG. 5.

Figure 5:
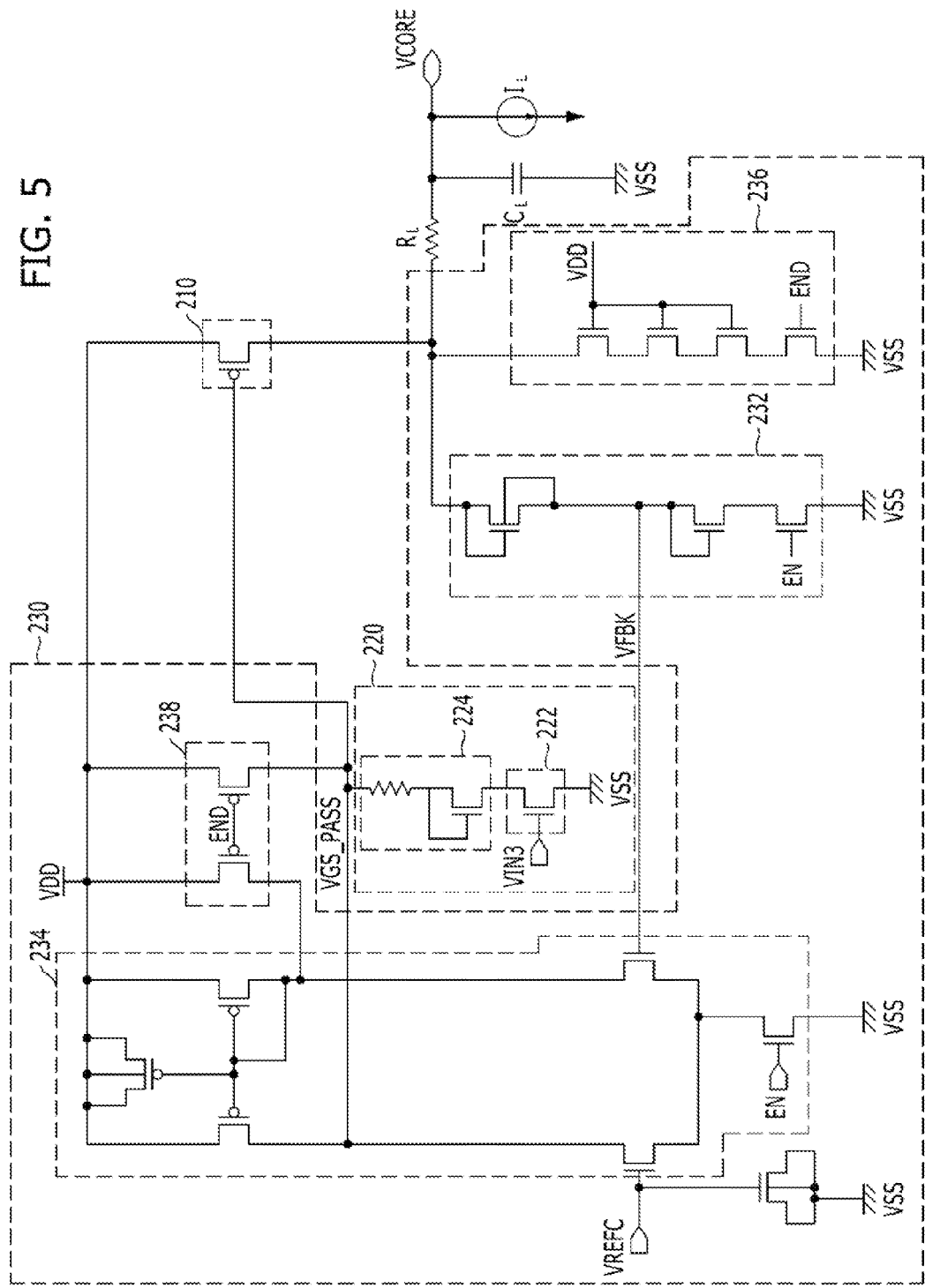
FIG. 5 is a circuit diagram of a driving unit, a first operation period defining unit and a second operation period defining unit included in the semiconductor integrated circuit illustrated in FIG. 4.

FIG. 5 is a circuit diagram of the driving unit 210, the first operation period defining unit 220 and the second operation period defining unit 230 included in the core voltage generator of FIG. 4.

Referring to FIG. 5, the driving unit 210 receives an output signal (hereinafter referred to as a comparison signal) VGS_PASS of the first and second operation period defining units 220 and 230 as a gate input, and includes a PMOS transistor having a source and a drain connected between a power supply voltage (VDD) terminal and a core voltage (VCORE) terminal.

The first operation period defining unit 220 includes a switching unit 222 configured to selectively connect a ground voltage (VSS) terminal and an output terminal of the comparison signal VGS_PASS in response to the first control signal VIN3, and a resistor unit connected between the switching unit 222 and the output terminal of the comparison signal VGS_PASS. Herein, the resistor unit 224 may have a suitable resistance, and may be omitted. The first operation period defining unit 220 is configured to control the voltage level of the output terminal of the comparison signal VGS_PASS in response to the first control signal VIN3. Hereinafter, the first operation period defining unit 220 will be referred to as a voltage level controlling unit.

The second operation period defining unit 230 includes a dividing unit 232 configured to divide the core voltage VCORE in a predetermined division ratio, and a comparing unit 234 configured to compare the reference voltage VREFC and the feedback voltage VFBK fed back by the dividing unit 232 and output the comparison signal VGS_PASS. The dividing unit 232 includes one or more resistors between the core voltage (VCORE) terminal and a ground voltage (VSS) terminal with respect to an output terminal of the feedback voltage VFBK. Since the dividing unit 232 has resistors with the same voltage difference between both ends, the feedback voltage VFBK corresponds to a half core voltage VFBK that is a mean voltage between the core voltage VCORE and the ground voltage VSS. The comparing unit 124 includes a current-mirror differential amplifier, and may include an NMOS type. The second operation period defining unit 230 may further include a sinking unit 236 connected to the core voltage (VCORE) terminal to decrease the voltage level of the core voltage VCORE when the voltage level of the core voltage VCORE increases excessively, and a precharge unit 238 configured to precharge an output (VGS_PASS) terminal of the comparing unit 124.

Referring to FIG. 4, the control signal generating unit 240 may include a delay unit configured to delay the active command ACT by a predetermined period to generate the first control signal VIN3. In another exemplary embodiment, the control signal generating unit 240 may include a delay unit configured to delay the active command ACT by a predetermined period, and a pulse width controlling unit configured to control the pulse width of the delayed active command outputted from the delay unit and generate the first control signal VIN3. The pulse width is controlled to more finely control the second operation period of the driving unit 210. Although not illustrated in the drawings, the pulse width controlling unit may be implemented using a typical pulse generator.

Although not illustrated in the drawings, the semiconductor memory device includes an internal circuit that uses the core voltage VCORE to perform a predetermined operation. For example, the internal circuit may be a bit line sense amplifier BLSA. The bit line sense amplifier BLSA operates according to a second control signal derived from the active command ACT. The first control signal VIN3 is activated before the second control signal, and may have an active period partially overlapping that of the second control signal.

A method for driving the core voltage generator of the semiconductor memory device of FIG. 4 in accordance with an exemplary embodiment of the present invention will be described below with reference to FIG. 6.

Figure 6:
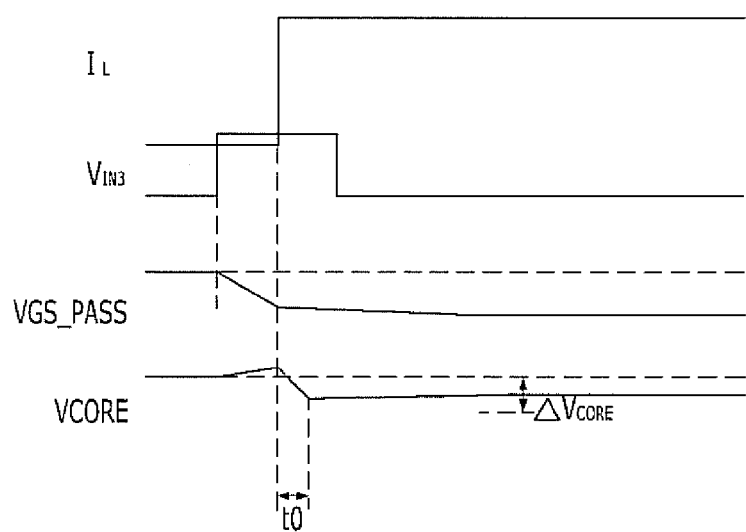
FIG. 6 is a timing diagram illustrating a method for driving the semiconductor integrated circuit of FIG. 4 in accordance with an exemplary embodiment of the present invention.

FIG. 6 is a timing diagram illustrating a method for driving the core voltage generator of the semiconductor memory device of FIG. 4 in accordance with an exemplary embodiment of the present invention.

Referring to FIG. 6, when the core voltage VCORE maintains the target level, the comparison signal VGS_PASS maintains a constant voltage level.

In this state, when the active command ACT is activated and the first control signal VIN3 is activated in the first operation period, the voltage level controlling unit 220 controls the voltage level of the comparison signal VGS_PASS. That is, the voltage level controlling unit 220 is configured to operate the driving unit 210 for driving the core voltage (VCORE) terminal to the power supply voltage VDD, before a predetermined operation time point. Accordingly, the voltage level of the core voltage VCORE increases above the target level by a predetermined voltage level.

When the second control signal derived from the active command ACT is activated during the second operation period, the internal circuit (which uses the core voltage VCORE to perform a predetermined operation) operates and an excessive load current IL occurs at the core voltage (VCORE) terminal, thus causing a voltage drop phenomenon that the core voltage VCORE increased to the predetermined voltage level decreases to the target level.

Then, the voltage level of the feedback voltage VFBK outputted from the dividing unit 232 decreases, and the decreased feedback voltage VFBK decreases below the reference voltage VREFC, so that the comparison signal VGS_PASS outputted from the comparing unit 234 continuously maintains the voltage level for driving the driving unit 210.

Thereafter, when the voltage level of the core voltage VCORE reaches the target level, the operation of the driving unit 210 is interrupted by the comparing unit 234. The time taken for the core voltage VCORE to reach the target level, that is, the recovery time is improved over the conventional one. The reason for this is that the variation ΔV of the core voltage VCORE becomes smaller than the conventional one because the core voltage VCORE with a voltage drop is compensated by the increased voltage level. It is apparent that the recovery time of the core voltage VCORE to the target level increases as the variation ΔV of the core voltage VCORE increases due to an excessive voltage drop. However, the recovery time can be reduced if the variation ΔV of the core voltage VCORE can be minimized even in the event of an excessive voltage drop.

In accordance with the exemplary embodiments of the present invention, the variation of the core voltage is minimized even in the event of an excessive voltage drop due to the operation of the internal circuit, thereby making it possible to minimize the recovery time of the core voltage.

The internal voltage terminal is driven before the operation time point of the internal circuit using the internal voltage, thereby preventing an excessive voltage drop of the internal voltage terminal. Therefore, the time taken for the voltage level of the internal voltage terminal to reach the target level is reduced, thus making it possible to prevent a malfunction of the internal circuit by an improved response speed while minimizing the power consumption.

While the present invention has been described with respect to the specific embodiments, it will be apparent to those skilled in the art that various changes and modifications may be made without departing from the spirit and scope of the invention as defined in the following claims.

What is claimed is:

1. A semiconductor integrated circuit comprising:
a driving unit configured to drive an internal voltage terminal;
a first operation period defining unit configured to define a first operation period of the driving unit in response to a control signal that is activated at a predetermined time before an operation time point of an internal circuit using an internal voltage; and
a second operation period defining unit configured to define a second operation period of the driving unit according to a voltage level state of the internal voltage with respect to a reference voltage.

2. The semiconductor integrated circuit of claim 1, wherein the first operation period defining unit and the second operation period defining unit share an output terminal with each other.

3. The semiconductor integrated circuit of claim 1, wherein the first operation period and the second operation period are defined in a continuous manner.

4. The semiconductor integrated circuit of claim 1, wherein the first operation period and the second operation period overlap partially each other.

5. The semiconductor integrated circuit of claim 1, further comprising a control signal generating unit configured to generate the control signal in response to an active command.

6. A semiconductor integrated circuit comprising:
a comparing unit configured to compare a feedback voltage with a reference voltage;
a driving unit configured to drive an internal voltage terminal in response to an output signal of the comparing unit; and
a voltage level controlling unit configured to control a voltage level of the output signal of the comparing unit in response to a first control signal that is activated at a predetermined time before an operation time point of an internal circuit using an internal voltage.

7. The semiconductor integrated circuit of claim 6, further comprising a control signal generating unit configured to generate the first control signal in response to an active command.

8. The semiconductor integrated circuit of claim 7, wherein the control signal generating unit comprises a delay unit configured to delay the active command.

9. The semiconductor integrated circuit of claim 8, further comprising a pulse width controlling unit configured to control a pulse width of the delayed active command outputted from the delay unit.

10. The semiconductor integrated circuit of claim 7, wherein the internal circuit operates in response to a second control signal derived from the active command.

11. The semiconductor integrated circuit of claim 10, wherein the first control signal is activated at the predetermined time before the second control signal.

12. The semiconductor integrated circuit of claim 11, wherein the first control signal and the second control signal have activation periods overlapping partially each other.

13. The semiconductor integrated circuit of claim 6, further comprising a dividing unit connected between the internal voltage terminal and a ground voltage terminal to divide the internal voltage in a predetermined division ratio to output the feedback voltage.

14. The semiconductor integrated circuit of claim 6, wherein the comparing unit comprises a current-mirror differential amplifier.

15. The semiconductor integrated circuit of claim 6, further comprising a sinking unit between the internal voltage terminal and a ground voltage terminal.

16. The semiconductor integrated circuit of claim 6, further comprising a precharge unit configured to precharge an output terminal of the comparing unit.

17. The semiconductor integrated circuit of claim 6, wherein the voltage level controlling unit comprises a switching unit configured to selectively connect a ground voltage terminal and an output terminal of the comparing unit in response to the first control signal.

18. The semiconductor integrated circuit of claim 17, wherein the voltage level controlling unit further comprises a resistor unit between the output terminal of the comparing unit and the switching unit.

19. A method for driving a semiconductor integrated circuit that drives an internal voltage terminal to a predetermined voltage according to a voltage level state of the internal voltage terminal, comprising:
    operating a driving unit for driving the internal voltage terminal, before a predetermined operation time point, if an active command is activated;
    performing a predetermined operation by an internal voltage at the predetermined operation time point, while the driving unit is operating; and
    interrupting an operation of the driving unit if a voltage level of the internal voltage terminal with a voltage drop caused by the predetermined operation reaches a target level due to a continuous operation of the driving unit.

20. The method of claim 19, wherein the interrupting of the operation of the driving unit comprises:
    dividing the internal voltage in a predetermined division ratio to generate a feedback voltage; and
    comparing the feedback voltage with a predetermined reference voltage and interrupting the operation of the driving unit if the feedback voltage is higher than the predetermined reference voltage.

\* \* \* \* \*